(12) United States Patent
Miura

(10) Patent No.: US 7,479,297 B2
(45) Date of Patent: Jan. 20, 2009

(54) METHOD OF MANUFACTURING A MULTI-LAYERED WIRING BOARD

(75) Inventor: Hirotsuna Miura, Nagano (JP)

(73) Assignee: Seiko Epson Corporation (JP)

( * ) Notice: Subject to any disclaimer, the term of this patent is extended or adjusted under 35 U.S.C. 154(b) by 36 days.

(21) Appl. No.: 11/201,081

(22) Filed: Aug. 10, 2005

(65) Prior Publication Data

US 2006/0045962 A1 Mar. 2, 2006

(30) Foreign Application Priority Data

Aug. 25, 2004 (JP) .............................. 2004-244842

(51) Int. Cl.
*B05D 5/12* (2006.01)
*B05D 3/00* (2006.01)

(52) U.S. Cl. .................... 427/97.1; 427/98.4; 427/98.9; 427/256; 427/553

(58) Field of Classification Search ................ 427/97.1, 427/98.4, 98.9, 256, 553
See application file for complete search history.

(56) References Cited

U.S. PATENT DOCUMENTS

| | | | | |
|---|---|---|---|---|
| 6,384,345 B1 * | 5/2002 | Akiha | ........................ | 174/261 |
| 6,402,403 B1 * | 6/2002 | Speakman | ............. | 400/120.03 |
| 6,503,831 B2 * | 1/2003 | Speakman | .................... | 438/674 |
| 6,786,589 B2 * | 9/2004 | Suzuki et al. | ................ | 347/102 |
| 7,202,155 B2 * | 4/2007 | Fukuchi | ...................... | 438/622 |
| 2004/0145858 A1 * | 7/2004 | Sakurada | ..................... | 361/600 |
| 2004/0226929 A1 | 11/2004 | Miura | | |
| 2005/0242394 A1 | 11/2005 | Nakabayashi et al. | | |

FOREIGN PATENT DOCUMENTS

| JP | 10-200258 | 7/1998 |
|---|---|---|
| JP | 10-284841 | 10/1998 |
| JP | 11-274671 | 10/1999 |
| JP | 2003-309369 | * 10/2003 |
| JP | 2003-318542 | 11/2003 |
| JP | 2004-095896 | 3/2004 |
| JP | 2004-221146 | 8/2004 |
| JP | 2005-95849 | 4/2005 |

* cited by examiner

*Primary Examiner*—Brian K Talbot
(74) *Attorney, Agent, or Firm*—Harness, Dickey & Pierce, P.L.C.

(57) ABSTRACT

There provided a method of manufacturing a multi-layered wiring board having at least two conductor layers, an interlayer insulation layer provided between the conductor layers, and a conductor post that electrically connects the conductor layers, on a substrate. In the method, the conductor post is formed by repeatedly performing: coating a droplet containing a conductive material, applying light energy to the coated droplet, and accumulating and coating a subsequent droplet on the droplet to which the light energy is applied.

7 Claims, 5 Drawing Sheets

METHOD OF MANUFACTURING A MULTI-LAYERED WIRING BOARD

RELATED APPLICATIONS

This application claims priority to Japanese Patent Application No. 2004-244842 filed Aug. 25, 2004 which is hereby expressly incorporated by reference herein in its entirety.

BACKGROUND OF THE INVENTION

1. Technical Field

The present invention relates to a method of manufacturing a multi-layered wiring board, to an electronic device, and to an electronic apparatus including a multi-layered wiring board manufactured by the above method.

2. Related Art

Conventionally, a method of manufacturing a multi-layered printed wiring board includes a method implemented by the following processes.

A single-layer substrate on which a pattern is formed by etching is positioned, and then respective layers are laminated thereon. In order to electrically connect upper and lower wiring-line layers, a through hole is formed in a given location of the substrate. By making the circumference of the through hole using plating have conductivity, etc. or by filling the through hole with conductive paste, a multi-layered printed wiring board is formed.

In this method, however, pads on which components are mounted cannot be formed in the through hole portion, and the diameter of the through hole is generally about 0.3 mm. Accordingly, this method is difficult to be used for high-density mounting.

In light of this background, a method was disclosed in which a multi-layered printed wiring board for high-density mounting is manufactured using photosensitive resin without penetrating the substrate (see e.g., Japanese Unexamined Patent Application Publication No. 10-284841 and No. 10-200258). However, since this fabrication method includes a photolithography process or a screen printing process, the process becomes complicated. It is also difficult to form a minute pattern in which the ratio (L/S) of the line width to the space width is about 30 μm/30 μm.

In view of the above, a method has been proposed in which a wiring line or an insulating layer is formed using a droplet discharge method such as an inkjet method (see e.g., Japanese Unexamined Patent Application Publication No. 2003-309369 and No. 2003-318542).

The known techniques as described above, however, have the following problems.

If multi-layered wiring of a multi-layered printed wiring board, etc. is to be formed, a conductor post is needed to electrically connect the lower wiring line and the upper wiring line. As far as the conductor post is concerned, if the conductor post is formed by the droplet discharge method such as an inkjet method, the height of the conductor post obtained becomes unstable due to spreading by wetting. This makes it difficult to control the height of the conductor post. Accordingly, when a plurality of conductor posts is formed on the same surface, it is difficult to control the height of the conductor posts. Thus, there is a possibility that defective continuity may occur between the lower wiring line and the upper wiring line due to variations in height between the conductor posts.

Furthermore, a photolithography process using a mask is frequently used in order to form the conductor posts. There is also a problem in that the productivity is low.

SUMMARY

An advantage of the invention is that it provides a method of manufacturing a multi-layered wiring board in which the height of a conductor post can be controlled so as to contribute to improvement of productivity, and electronic devices and electronic apparatuses having a multi-layered wiring board fabricated by the method.

In order to achieve this, the invention has the following construction.

A method of manufacturing a multi-layered wiring board is a method of manufacturing a multi-layered wiring board having at least two conductor layers, an interlayer insulation layer provided between the conductor layers, and a conductor post that electrically connects the conductor layers, on a substrate. In the method, the conductor post is formed by repeatedly performing coating a droplet containing a conductive material, applying light energy to the coated droplet, and accumulating and coating a subsequent droplet on the droplet to which the light energy is applied.

Accordingly, in the manufacturing method of the multi-layered wiring board according to the invention, a droplet containing a coated conductive material can be fixed through dry or baking without spreading the droplet by wetting, by applying light energy to the droplet. Further, the subsequent droplet is coated on the fixed droplet and then is fixed by applying light energy. In this way, a conductor post in which a plurality of the droplets is laminated can be obtained. The conductor post has almost the same thickness as that of the droplet diameter. Thus, not only can the conductor post have a minute diameter, but also desired height accuracy can be obtained (controlled) depending upon the number of accumulated coated droplets. Therefore, in the case where a multi-layered wiring board is formed in such a way that a plurality of conductor posts is formed in the same process, it is possible to prevent generation of defective continuity among wiring-line layers because of variations in the height between the conductor posts.

The time from when the droplet is coated until when the light energy is applied is preferably set based on surface energy of the discharged droplet, in particular, to the time where the light energy can be applied before wetting of the droplet spreads at a landing portion according to surface energy.

In this case, since the droplet is fixed while it has a small diameter, a conductor post having a minute diameter can be easily realized.

Furthermore, even when a landing portion has lyophilic property, the conductor post having a minute diameter can be formed without depending on the surface energy of the landing portion because the droplet is small in diameter is fixed. In particular, by coating a droplet on the lyophilic landing portion having high surface energy, adhesiveness between the conductor layer and the conductor post can be improved.

Further, in the invention, it is preferred that the amount of applied light energy is set depending upon the landing portion of the droplet.

In this construction, for example, a case where a landing portion of a droplet is a conductor layer and a case where the landing portion of the droplet is a droplet have different reflectance ratios to light. Thus, the amount of light energy applied to droplets is different in the cases even when being irradiated with light having the same energy. As such, the energy amount actually applied to the droplets can be made constant by setting the amount of applied light energy according to the material of the landing portion.

Further, in the invention, the sequence having a process of detecting a top location of the accumulated droplets, and a process of adjusting the location on which the light energy is applied based on the detected top location is be preferably used.

Accordingly, even if a top location changes due to accumulated droplets, light energy can be applied to an adequate location, thereby performing sufficient dry or baking.

The method of detecting the top location can employ a method of installing a photodetector, a method of detecting the spreading of reflected light, a method of detecting distribution of diffracted light, and the like.

In addition, in a state where the correlation between the discharge number of droplets and the height of a conductor post is found beforehand, the location on which light energy is applied can be controlled depending upon the number of discharged droplets.

Further, in the invention, a construction having a process of coating the droplet while relatively moving a plurality of nozzles that discharge the droplets, respectively, and the substrate with regard to each other is preferably used. In this case, the relative moving velocity of the substrate and the discharge frequency of the droplets are synchronized with each other according to an array pitch of the nozzles.

Accordingly, in the invention, since discharged droplets are accumulated on the substrate (a conductor layer) according to an array pitch of nozzles, it is unnecessary to stop a substrate (or nozzle) in order to form a conductor post. There is also no time loss incurred by acceleration and deceleration of the substrate (or nozzles), resulting in the improved productivity.

Furthermore, where the droplet is coated while relatively moving a plurality of nozzles that discharge the droplets, respectively, and the substrate with regard to each other, irradiation distribution of the light energy preferably has an elliptical shape whose longitudinal direction is the relative moving direction.

In this construction, while a substrate (or nozzles) relatively moves at the next landing location, the droplet can be dried or baked.

The droplet preferably contains a photothermal conversion material.

In this construction, light energy applied can be converted into thermal energy in an efficient manner. It is thus possible to efficiently dry or bake droplets. The photothermal conversion material can employ a well-known material, and can include any materials if they can convert light into heat efficiently. For example, the photothermal conversion material can include aluminum, a metal layer consisting of oxide and/or sulfide, an organic layer composed of polymer to which carbon black, graphite or IR-photosensitive dye is added, and so on. IR-photosensitive dye can include anthraquinone series, dithiol nickel complex series, cyanine series, azo cobalt complex series, diimmonium series, squarylium series, phthalocyanine series, naphthalocyanine series, and the like. Furthermore, the photothermal conversion material can be dissolved or distributed in binder resin using synthetic resin such as epoxy resin as a binder.

Further, in the invention, the at least two conductor layers and the interlayer insulation layer are preferably formed by means of the droplet discharge method.

Accordingly, since a structure on a substrate can be formed by the droplet discharge process, it is unnecessary to perform the photolithography process using the mask. This can contribute to improvement of the productivity.

Meanwhile, an electronic device according to the invention is an electronic device including a multi-layered wiring board having at least two wiring-line layers, an interlayer insulation layer provided between the wiring-line layers, and a conductor post that electrically connects the wiring-line layers, on a substrate. The conductor post is manufactured by means of the aforementioned manufacturing method.

Furthermore, an electronic apparatus according to the invention is an electronic apparatus including a multi-layered wiring board having at least two wiring-line layers, an interlayer insulation layer provided between the wiring-line layers, and a conductor post that electrically connects the wiring-line layers, on a substrate. The conductor post is manufactured by means of the aforementioned manufacturing method.

Accordingly, in the invention, since the height of a conductor post to be obtained can be controlled, compact electronic devices and electronic apparatuses with accurate precision are realized.

BRIEF DESCRIPTION OF THE DRAWINGS

The invention will be described with reference to the accompanying drawings, wherein like numbers reference like elements, and wherein.

DESCRIPTION OF THE EMBODIMENTS

Hereinafter, a method of manufacturing a multi-layered wiring board, electronic devices, and electronic apparatuses according to the invention will be described in connection with embodiments with reference to FIGS. 1 to 8.

First Embodiment

A droplet coating apparatus applicable to a method of manufacturing a multi-layered wiring board according to the invention will be described first.

The droplet coating apparatus employs a droplet discharge apparatus (an inkjet device), which is used to discharge droplets through a droplet discharge head and coat a substrate with them.

Figure 1:
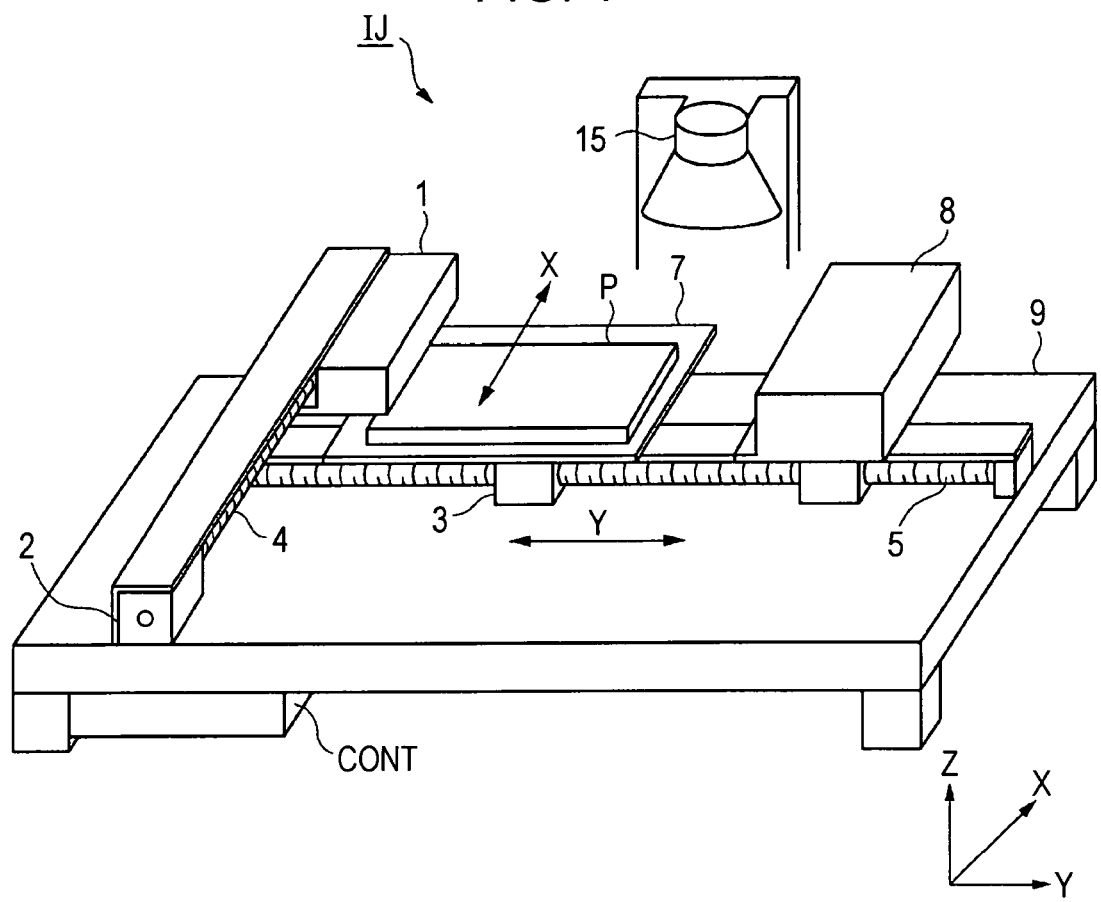
FIG. 1 is a schematic perspective view showing the structure of a droplet discharge apparatus according to the invention.

FIG. 1 is a schematic perspective view showing the construction of a droplet discharge apparatus IJ according to the invention.

The droplet discharge apparatus (a droplet coating apparatus) IJ includes a droplet discharge head 1, an X-axis-direction driving shaft 4, a Y-axis-direction guide shaft 5, a control device CONT, a stage 7, a cleaning mechanism 8, a base 9, and a heater 15.

The stage 7 supports a substrate P to which ink (a liquid material) is supplied by the droplet discharge apparatus IJ. The stage 7 includes a fixing mechanism (not shown) that fixes the substrate P to a reference location.

The droplet discharge head 1 is a droplet discharge head of a multi-nozzle type, including a plurality of discharge nozzles. The longitudinal direction and the Y-axis-direction of the droplet discharge head 1 are coincident with each other. The plurality of discharge nozzles is arranged parallel to the Y-axis-direction at the bottom of the droplet discharge head 1 at a predetermined distance. The ink containing minute conductive particles is discharged from the discharge nozzles of the droplet discharge head 1 to the substrate P supported on the stage 7.

To the X-axis-direction driving shaft 4 is coupled an X-axis-direction driving motor 2. The X-axis-direction driving motor 2 can be a stepping motor, etc., and rotates the X-axis-direction driving shaft 4 according to an X-axis-direction driving signal supplied from the control device CONT. If the X-axis-direction driving shaft 4 rotates, the droplet discharge head 1 moves in the X-axis-direction.

The Y-axis-direction guide shaft 5 is fixed to the base 9 in such a way that it does not move with respect to the base 9. The stage 7 has a Y-axis-direction driving motor 3. The Y-axis-direction driving motor 3 can be a stepping motor, etc., and moves the stage 7 in the Y-axis-direction according to a Y-axis-direction driving signal supplied from the control device CONT.

The control device CONT applies a voltage for droplet discharge control to the droplet discharge head 1. The control device CONT also applies a driving pulse signal to control the movement in the X-axis-direction of the droplet discharge head 1 to the X-axis-direction driving motor 2, and applies a driving pulse signal to control the movement in a Y-axis-direction of the stage 7 to the Y-axis-direction driving motor 3.

The cleaning mechanism 8 serves to clean the droplet discharge head 1. The cleaning mechanism 8 is provided with a Y-axis-direction driving motor (not shown). If the Y-axis-direction driving motor is driven, the cleaning mechanism moves along the Y-axis-direction guide shaft 5. The movement of the cleaning mechanism 8 is also controlled by the control device CONT.

The heater 15 is means for annealing the substrate P through lamp annealing, and evaporates and dries a solvent contained in a liquid material coated on the substrate P. The supply of power to the heater 15 is also controlled by means of the control device CONT.

The droplet discharge apparatus IJ discharges droplets toward the substrate P, while relatively scanning the droplet discharge head 1 and the stage 7 that supports the substrate P. In the following description, it is assumed that the Y-axis-direction is a scanning direction, and the X-axis-direction orthogonal to the Y-axis-direction is a non-scanning direction. Accordingly, the discharge nozzles of the droplet discharge head 1 are provided side-by-side at regular intervals in the X-axis-direction, which is the non-scanning direction. Meanwhile, it has been shown in FIG. 1 that the droplet discharge head 1 is disposed perpendicular to a traveling direction of the substrate P. However, the droplet discharge head 1 can be disposed to cross the traveling direction of the substrate P by adjusting an angle of the droplet discharge head 1. As such, the nozzle pitch can be controlled by adjusting the angle of the droplet discharge head 1. Instead, a distance between the substrate P and the nozzle surface can be controlled arbitrarily.

Discharge techniques regarding the droplet discharge method can include an electrostatic charge control method, a pressurization vibration method, an electromechanical conversion method, an electrothermal conversion method, an electrostatic suction method and so on. The electrostatic charge control method includes discharging a material through nozzles in such a manner that a charge is applied to the material through a charged electrode and the flight direction of the material is controlled through a deflection electrode. Further, in the pressurization vibration method, a high voltage of about $3 \times 10^5$ Pa is applied to the material, and the material is discharged toward the front end of a nozzle. When a control voltage is not applied, the material is discharged in a straight line from the nozzle. If the control voltage is applied, electrostatic reaction occurs in the material. Thus, the material disperses and is not discharged from the nozzle. Further, the electromechanical conversion method uses the property of a piezo element (a piezoelectric element) where it deforms according to a pulsed electrical signal. If the piezoelectric element deforms, pressure is applied to the space containing the material through a flexible material, and the material is pushed out from the space and is then discharged from the nozzle.

Figure 2:
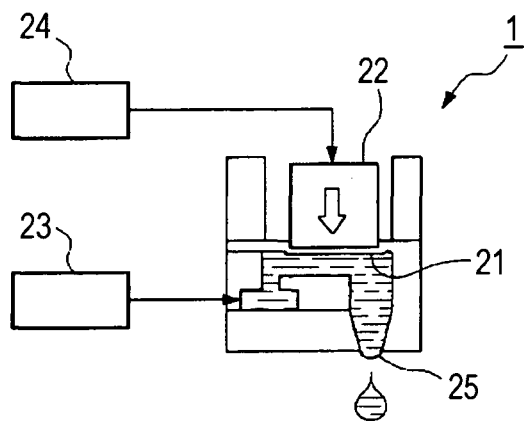
FIG. 2 is a view for explaining the principle of discharging liquid substance by way of the piezo method.

FIG. 2 is a view for explaining the principle of discharging liquid substance by means of the piezo method.

In FIG. 2, a piezo element 22 is disposed adjacent to a liquid chamber 21 that contains a liquid material (a functional solution). The liquid chamber 21 is supplied with the liquid material through a liquid material supply system 23 having a material tank in which the liquid material is contained. The piezo element 22 is coupled to a driving circuit 24. The driving circuit 24 applies a voltage to the piezo element 22, which deforms. This causes the liquid chamber 21 to be deformed, so that the liquid material can be discharged from a nozzle 25. At this time, the strain amount of the piezo element 22 can be controlled by changing the value of the voltage applied into a predetermined driving waveform. Further, the strain rate of the piezo element 22 can also be adjusted by changing the frequency of the voltage applied.

Furthermore, the droplet discharge method can also use a bubble (thermal) method in which a liquid material is discharged using bubbles generated by heating the liquid material. At this time, the method of discharging droplets using the piezo method is advantageous in that it rarely affects the composition of a material because heat is not applied to the material.

Figure 3:
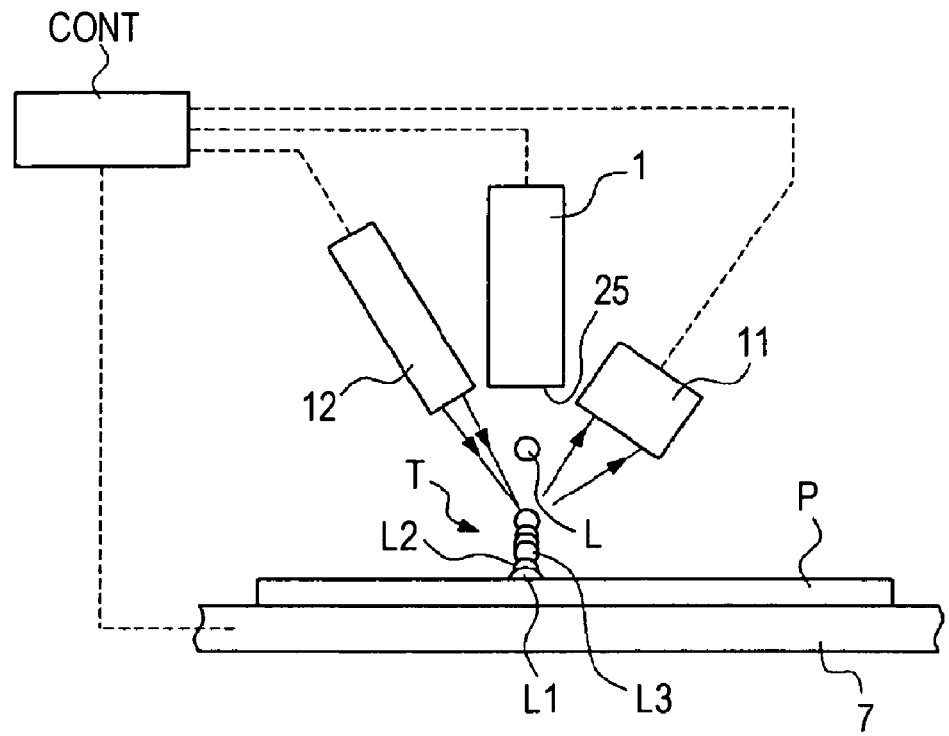
FIG. 3 is a view illustrating a construction in which a photodetector and a laser light source are disposed adjacent to a droplet discharge head.

Further, in this embodiment, as shown in FIG. 3, a photodetector 11 is disposed at one side of a scanning direction of the droplet discharge head 1. A laser light source 12 is disposed at the other side of the scanning direction of the droplet discharge head 1, and is provided in each of the plurality of nozzles. The photodetector 11 irradiates detecting light at a location immediately below the droplet discharge head 1, detects a top location of accumulated (overlapped) droplets by detecting reflected light therefrom, and outputs the detected results to the control device CONT.

Furthermore, a top location of droplets can be detected by means of a method of checking the spreading of reflected light, a method of checking the distribution of diffracted light, and so on. Further, in a state where a relation between the number of discharge droplets and the top location of previously accumulated droplets is found, the top location can be obtained depending upon the number of discharged droplets. In this case, the photodetector can be omitted.

Figure 4:
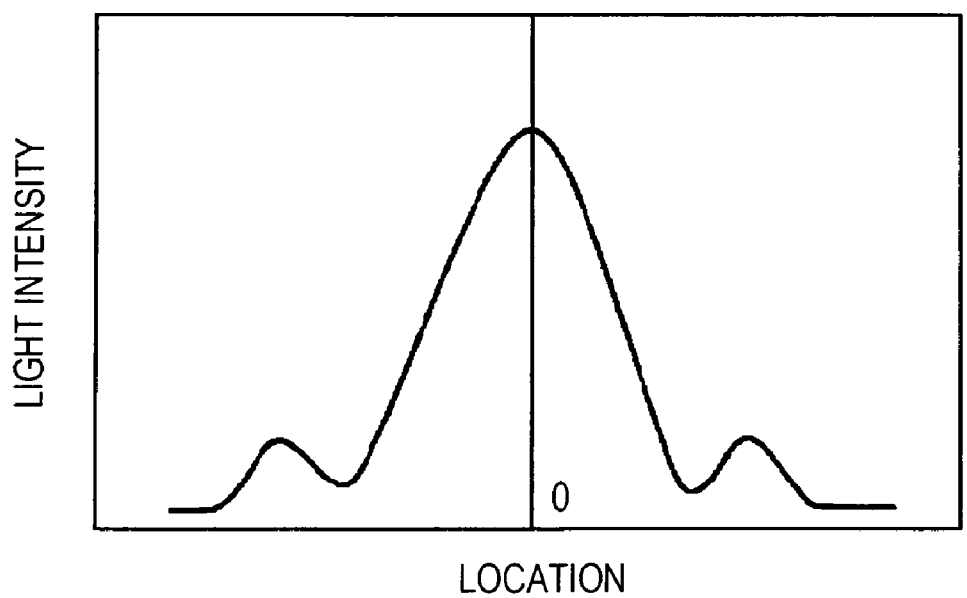
FIG. 4 is a graph showing the relation between the location and the light intensity of laser light.

The laser light source 12 is used to obliquely irradiate laser light toward the bottom of the droplet discharge head 1 under the control of the control device CONT. The laser light source 12 has an optical element (not shown) that focuses laser light. The control device CONT serves to control a focal position of laser light, i.e., a location at which the light energy is applied by the laser light, by adjusting the location of the optical element. Further, in the embodiment, in order to effectively apply light energy to droplets of a minute diameter, a beam profile in which the light intensity of the center of a beam is raised, as shown in FIG. 4, is used.

A method of forming a conductive columnar body by means of the droplet coating method using the droplet discharge apparatus IJ will now be described.

First, a droplet (conductive ink) containing a conductive material will be described.

The conductive ink is composed of dispersion liquid in which minute conductive particles are dispersed in a dispersing medium.

In the embodiment, the minute conductive particles can be minute metal particles containing one of gold, silver, copper, palladium and nickel, oxide thereof, a conductive polymer, minute particles of a superconductive material, or the like.

These minute conductive particles can have their surface coated with organic matter, etc. in order to improve the dispersibility. The grain diameter of the minute conductive particles is preferably in the range of 1 nm to 0.1 μm. If the grain size is 0.1 μm or higher, there is a possibility that the nozzle of the liquid discharge head to be described below will become clogged. Meanwhile, if the grain size is 1 nm or less, the volume ratio of a coating agent to the minute conductive particles is high, and the ratio of organic matter in a film obtained becomes excessively high.

The dispersing medium is not specifically limited so long as it can disperse minute conductive particles and does not cause aggregation. For example, the dispersing medium can include water, all alcohol such as methanol, ethanol, proponal and butanol, hydrocarbon-based compounds such as n-heptane, n-octane, decane, dodecane, tetradecane, toluene, xylene, cymene, durren, indene, dipentene, tetrahydronaphthalene, decahydronaphthalene and cyclohexylbenzene, ether-based compounds such as ethyleneglycoldimethylether, ethyleneglycoldiethylether, ethyleneglycolmethylethylether, diethyleneglycoldimethylether, diethyleneglycoldiethylether, diethyleneglycolmethylethylether, 1,2-dimethoxyethane, bis(2-methoxyethyl) ether and p-dioxane, and polarity compounds such as propylenecarbonate, γ-butyrolactone, N-methyl-2-pyrrolidone, dimethylformamide, dimethylsulfoxide and cyclohexanone. Of these, in terms of the dispersibility of minute conductive particles, the stability of the dispersion liquid and facility of application to the droplet discharge method (inkjet method), water, alcohols, hydrocarbon-based compounds, and ether-based compounds are preferably used. More preferably, the dispersion media can include water and hydrocarbon-based compounds.

In this case, droplets of a silver (Ag) in nano-particle dispersed system (60 wt %) in an organic solvent (organic solvent; n-tetradecane) are discharged.

Furthermore, in the embodiment, a photothermal conversion material is contained in the conductive ink for droplet discharge. The photothermal conversion material can include a metal layer composed of aluminum, oxide and/or sulfide thereof, an organic layer comprising polymer to which carbon black, graphite, or IR-photosensitive dye is added, and so on. The IR-photosensitive dye can include anthraquinone series, dithiol nickel complex series, cyanine series, azo cobalt complex series, diimmonium series, squarylium series, phthalocyanine series, naphthalocyanine series, and the like. Further, the photothermal conversion material can be dissolved or dispersed in binder resin by using synthetic resin, such as epoxy resin, as a binder.

In addition, the laser light can include a YAG laser (YAG fundamental wave; wavelength of 1064 nm), a YAG laser (YAG doubled wave; wavelength of 532 nm), a semiconductor laser (wavelength of 808 nm), a He—Cd laser (wavelength of 442 nm), a He—Cd laser (wavelength of 325 nm), a $YVO_4$ laser (wavelength of 266 nm) or the like. In the embodiment, a YAG laser (a Gaussian beam having a beam diameter of approximately 20 μm) is used. Further, in order to improve adhesiveness with ink, the substrate P can be given a lyophilic property (high surface energy) in advance by means of an IR irradiation process, an $O_2$ plasma process, etc.

In the embodiment, a plurality of nozzles 25 can be disposed in a direction perpendicular to the plane of FIG. 3, according to the location of a columnar body to be formed.

The substrate P is first moved relative to the droplet discharge head 1 and is then positioned at a location where a columnar body will be formed. The first droplet L is discharged from the nozzle 25 of the droplet discharge head 1 and is thus coated on the substrate P. The coated droplet L (this is referred to as "L1") immediately becomes circular because of surface tension. Since the surface of the substrate P has a lyophilic property, wetting of the droplet begins spreading after a predetermined time or a time depending upon the surface energy of the droplet (e.g., about 20 microsecond) elapses. Thus, wetting of the droplet spreads until the droplet L1 has a contact angle depending upon the surface energy of the substrate P and the droplet surface energy, over about several tens of milliseconds. This time is well known in the art. As such, the control device CONT irradiates laser light (e.g., 1.0 $W/mm^2$ for 1 millisecond) using the laser light source 12 before the droplet L1 spreads by wetting on the surface of the substrate P. The droplet L1 to which the light energy is applied by irradiating laser light is thus dried or baked. At this time, since it is acceptable if a subsequent drop (a second drop) is accumulated, the laser light applied to the droplet L1 does not need to have energy that can bake the droplet: it is sufficient that the laser light has energy that can dry the surface of the substrate P.

In particular, since the droplet L contains the photothermal conversion material, applied energy can be efficiently converted into heat. Thus, the droplet L1 can be dried or baked by applying heat to the droplet L1 in an effective way.

When the first drop of the droplet L1 is fixed, the control device CONT discharges a second drop of a droplet L2 on the droplet L1 through the droplet discharge head 1. As soon as the droplet L2 is coated on the droplet L1, laser light is irradiated on the droplet L2. In this case, the location where the laser light will be irradiated (the focal point) is set higher than the location of the droplet L1. For this reason, the control device CONT moves the optical element of the laser light source 12 based on a top location of the droplet L2, which is detected by the photodetector 11, and then changes the focal position of the laser light (the location where the light energy is applied) to the crown of the droplet L2.

Further, although the droplet L1 is coated on the substrate P, the droplet L1 and the droplet L2 have different reflectances at the laser irradiation point because the droplet L2 is coated on the droplet L1. Due to this, if the same light energy as that of the droplet L1 is applied to the droplet L2, there is a possibility that heat applied to the droplet L2 is too high, and the droplet L2 may evaporate. Due to this, the control device CONT sets the amount of applied light energy according to the material where the droplet lands, such as applying light energy (e.g., 0.5 W/mm² for 1 millisecond) lower than that of the first droplet L1 to droplets after the first drop of droplet L1.

As such, the droplet L2 can be coated and fixed on the droplet L1 while being accumulated on the droplet L1 in such a manner that the droplet L2 is dried or baked by applying light energy to the droplet L2.

In addition, in the same order, droplets after the droplet L2 can be coated onto the droplet L2 and then dried or baked. A columnar body T having a height of about several hundreds of microns can be formed on the substrate P.

A method of fabricating a multi-layered wiring board according to the invention will be described below.

Figure 5A:
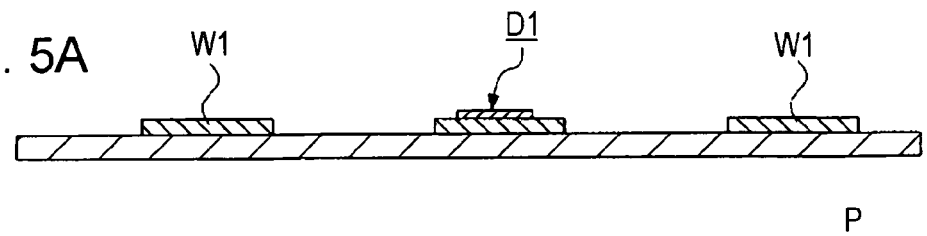
FIGS. 5A to 5D are processes illustrating a method of manufacturing a multi-layered wiring board according to the invention.
Figure 5B:
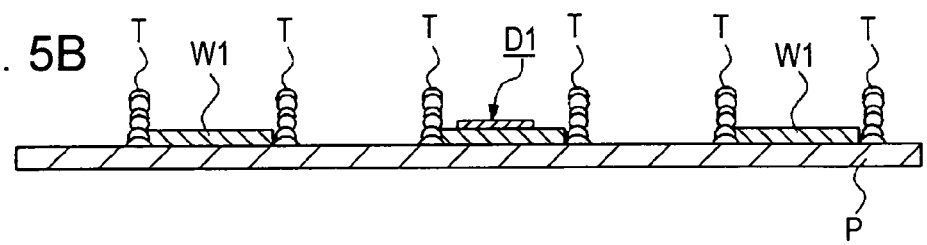
Figure 5C:
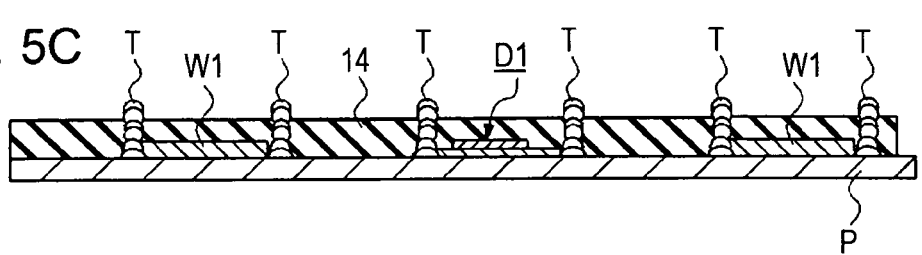
Figure 5D:
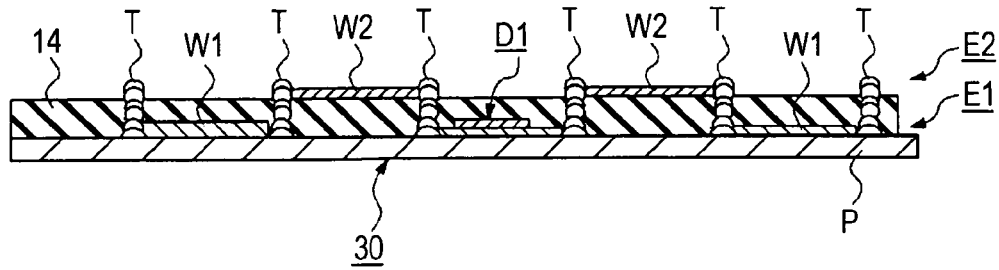

A case where a multi-layered wiring board 30 having two conductor layers E1 and E2, an interlayer insulation layer 14 provided between the conductor layers E1 and E2, and a conductor post T that electrically connects the conductor layers E1 and E2, on a substrate P, as shown in FIG. 5D, is manufactured will be described as an example.

As shown in FIG. 5A, wiring lines W1 serving as the first conductor layer E1, and an electronic device D1 are formed on the substrate P.

The substrate P on which conductive ink is dispersed (coated) can be a substrate made of polyimide. At this time, it is preferred that an ink-repellant process be previously performed on an ink coating surface of the substrate P before the conductive ink is coated. As such, if the ink-repellant process is performed in advance, it is possible to control the location of the conductive ink, etc. which is discharged (coated) on the substrate P with higher accuracy.

As shown in FIG. 5A, the substrate P is cleaned using IPA (isopropyl alcohol). The substrate P is further cleaned (UV irradiation cleaned) by irradiating it with UV, with a wavelength of 254 nm at an intensity of 10 mW/cm² for 10 minutes. In order to perform the ink-repellant process on the substrate P, 0.1 g of hexadecafluoro 1,1,2,2 tetrahydrodecyl-triethoxysilane and the substrate P are kept in an airtight 10-liter container at a temperature of 120° C. for 2 hours. Accordingly, an ink-repellant monomolecular film can be formed on the surface of the substrate P. The surface of the substrate P on which the monomolecular film is formed has a contact angle of about 60° with the conductive ink.

The contact angle of about 60° is too high in forming wiring lines by discharging (drawing) the conductive ink using the droplet discharge method. Accordingly, UV with a wavelength of 254 nm, which is the same as that used when the cleaning is performed, is irradiated onto the substrate P for 2 minutes. As a result, the contact angle of the surface of the substrate P with the conductive ink can be controlled to be approximately 35°.

Further, a ink-absorbing layer can be formed instead of performing the ink-repellant process. That is, a porous layer having porous silica particles, alumina, alumina hydrate, etc. and a binder, or a layer in which ink is swollen and absorbed by hydrophilic polymer is used as the ink-absorbing layer. The ink-absorbing layer can then be formed on the surface of the substrate P in advance.

The conductive ink from the droplet discharge head 1 of the droplet discharge apparatus IJ is dropped, as droplets, on the substrate P on which the ink-repellant process is performed. In such discharge, a method such as a discharge method disclosed in Japanese Unexamined Patent Application Publication No. 2003-133691 can be used. In other words, the discharge method in which plural droplets of conductive ink are discharged on the substrate P at a predetermined distance and the droplets again discharged to fill the gaps so that the conductive ink constituting the droplets is consecutive can be suitably used as the wiring line formation method. Plural wiring lines W1 having a line width of, e.g., 50 μm can be formed by means of discharging using the droplet discharge method before baking.

Further, in the embodiment, the electronic device D1 disposed on the substrate P is also formed by means of the droplet discharge method. The electronic device D1 can be a thin film transistor (TFT), which will be described in detail later.

Thereafter, coating of the conductive ink and irradiation of the laser light are repeatedly performed on the substrate P on which the electronic device D1 and the wiring line W1 are formed, thereby forming columnar bodies, each having the conductor post T having a height of e.g., 5 μm, as shown in FIG. 5B. At this time, each of the columnar bodies is coupled to the electronic device D1 or the wiring line W1.

An insulating material in the liquid state is coated by means of the droplet discharge method using the droplet discharge head 1 so that a part of an interlayer insulation layer is formed around the conductor post T, the electronic device D1 and the wiring line W1. As shown in FIG. 5C, an insulating layer (an interlayer insulation layer) 14 having a height (e.g., a thickness of 4 μm), which is slightly lower than that of the conductor post T, is formed in a state where a top surface of the conductor post T is exposed. An insulating material for forming the insulating layer 14, i.e., an insulating material for forming the interlayer insulation layer can include epoxy acrylate-based resin UVF-10G (trademark), which is a UV-hardening type insulating material available from Asahi Chemical Co. Ltd.

The insulating material is a UV-hardening type (a light-hardening type) and is also a non-soluble type. Thus, the film thickness of the insulating material rarely varies (reduces) before and after hardening. This allows the insulating material to be easily formed to a height depending upon the conductor post T. Accordingly, if the insulating material is disposed around the conductor post T (and the electronic device D1, the wiring line W1), all the insulating material is hardened by irradiating UV with a wavelength of 357 nm onto the insulating material at an intensity of 50 mW/cm² for about 1 minute.

In this case, the surface of the insulating material becomes smooth by way of a self-leveling effect, and the surface of the insulating layer 14 obtained thus also becomes smooth.

Thereafter, the conductive ink is discharged and then baked using the same method as that for forming the first conductor layer E1, thereby forming a wiring line W2, which is connected between predetermined conductor posts T, as the second conductor layer E2 on the interlayer insulation layer 14, as shown in FIG. 5D. The multi-layered wiring board 30 according to the invention is thus realized.

A TFT as the electronic device D1 will now be described with reference to FIG. 6.

Figure 6:
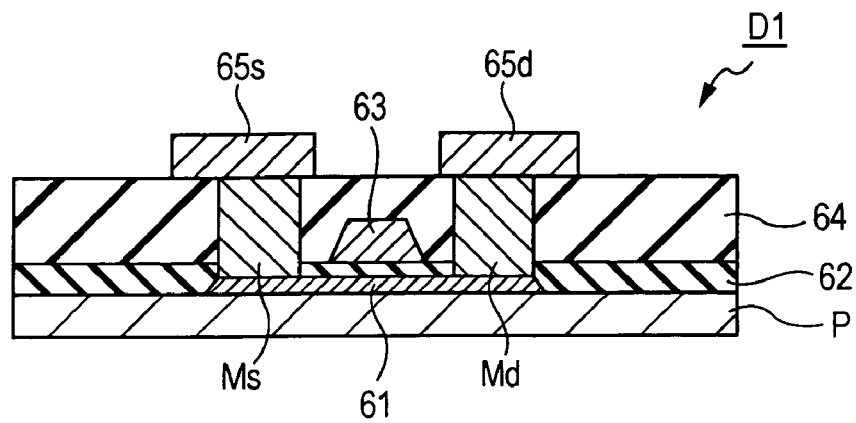
FIG. 6 is a view showing a schematic construction of a TFT.

In FIG. 6, in order to facilitate understanding of the drawing, the film thickness, the ratio of the dimensions, etc. in each component are different from each other.

A semiconductor film for forming an active layer of the TFT is formed on the substrate P. In the embodiment, it will be described that the semiconductor film is formed of an amorphous silicon film. It is to be understood that the semiconductor film can be formed using a semiconductor material such as germanium, however.

Then, the accumulated semiconductor film is crystallized. The crystallization process of the semiconductor film can be performed by a laser irradiation method, a rapid heating method (a lamp annealing method or a thermal annealing method, etc.), a solid-phase growth method, or the like.

A device isolation process for defining regions of the TFT is then performed to form a polycrystalline semiconductor film 61 having a predetermined shape on the substrate P.

Thereafter, conductor posts Ms and Md having a columnar shape are formed on the surface of the semiconductor film 61 by accumulating droplets containing a conductive material by repeatedly performing coating of the droplets and laser irradiation, as with the above-mentioned conductor post T. The conductor posts Ms and Md serve as contact plugs for electrically connecting a source region and a drain region of the semiconductor film 61 to a source intermediate electrode 65s and a drain intermediate electrode 65d to be described below, respectively.

Thereafter, as the above-mentioned interlayer insulation layer 14, a gate insulating film 62 made of silicon oxide, etc. is formed around the conductor posts Ms and Md, i.e., on the entire surface of the substrate except for the conductor posts Ms and Md, by means of the droplet discharge method. In this case, the gate insulating film 62 can be formed by discharging and coating droplets of coating liquid (a liquid material containing polysilazane), where polysilazane is mixed with xylene, from the droplet discharge head 1 onto the substrate.

The gate wiring line 63 is then patterned at a predetermined location on the gate insulating film 62 by means of the droplet discharge method, as the above-mentioned wiring lines W1 and W2. An interlayer insulation layer 64 is then formed to cover the gate insulating film 62, the gate wiring line 63, and the conductor posts Ms and Md, and to also expose the crown surface of the conductor posts Ms and Md. The method of forming the interlayer insulation layer 64 is the droplet discharge method, as the method of forming the gate insulating film 62.

Thereafter, as the gate wiring line 63, a source wiring line 65s including a source electrode and a drain wiring line 65d including a drain electrode are formed by means of the droplet discharge method so as to be connected to the conductor posts Ms and Md, respectively.

A TFT D1 is thereby fabricated.

As described above, in the embodiment, the conductor post T with an accurate height can be formed by repeatedly performing the process of applying light energy to a droplet containing a coated conductive material and then fixing the droplet, and the process of accumulating and coating the subsequent droplets on the fixed droplet. Further, the thickness (diameter) of the conductor post T results in a droplet diameter of the droplet discharge method in which the amount of a discharged droplet can be controlled with high accuracy. It is thus possible to easily form the conductor post T having a minute diameter. Further, in the embodiment, constitution layers of the multi-layered wiring board 30 having the electronic device D1, and the wiring lines W1 and W2, which constitute the conductor layers E1 and E2, or the interlayer insulation layer 14, as well as the conductor post T, are also formed by means of the droplet discharge method. This prevents the need for a photolithography process using a mask, and contributes to significant improvement of the productivity.

Moreover, in the embodiment, the time from when the droplet L is coated until when light energy is applied is set before the droplet L spreads by wetting, based on the surface energy of the droplet L. Therefore, even if a landing portion is lyophilic, the conductor post T with a minute diameter can be formed. Due to this, it is possible to form the conductor post T with high adhesiveness, with respect to the substrate P or the electronic device D1, and the wiring line W1. In addition, in the embodiment, since the amount of applied light energy is controlled according to the material of the landing portion of the droplet L, the problem of evaporation of the coated droplet L, for example, does not occur. Thus, a desired conductor post T can be formed in a stable manner. Further, in the embodiment, since the focal position of laser light is controlled based on detection results of the photodetector 11, the light energy can be effectively applied to each of the coated droplets even if the height of the droplet changes. It is thus possible to form the conductor post T rapidly and reliably. Furthermore, in the embodiment, since a photothermal conversion material is contained in the droplet L, light energy can be effectively converted into thermal energy, and therefore, a coated droplet is efficiently fixed.

Second Embodiment

Figure 7:
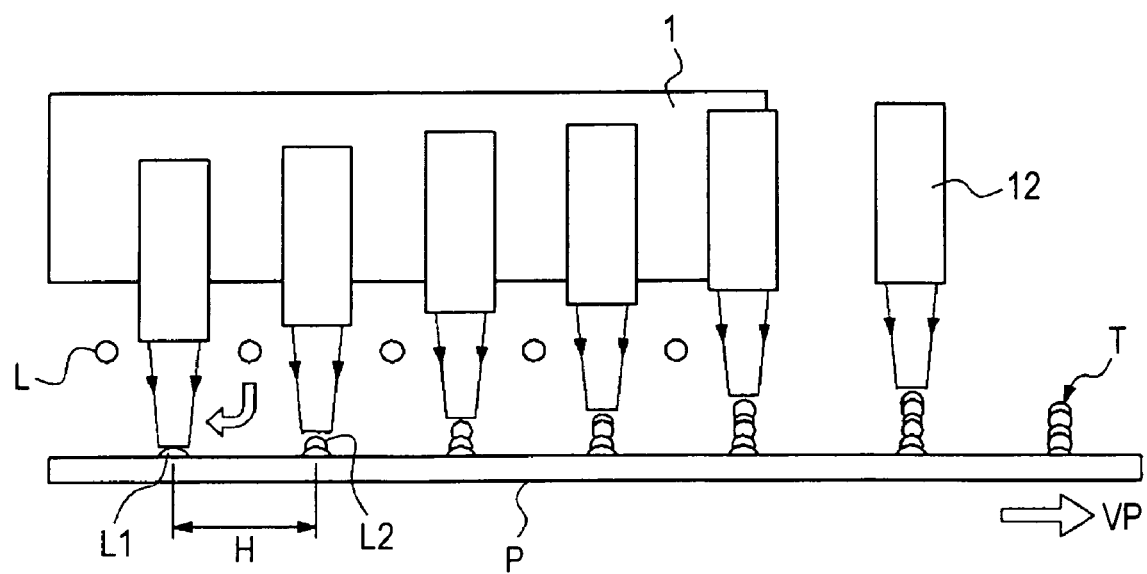
FIG. 7 is a view showing a method of manufacturing a multi-layered wiring board according to a second embodiment of the invention.

A method of manufacturing a multi-layered wiring board according to a second embodiment of the invention will be described with reference to FIG. 7.

In the first embodiment, the construction in which the droplet L is coated in a state where the relative motion of the droplet discharge head 1 (the nozzle 25) and the substrate P are stopped has been described. In the embodiment, however, a case where a droplet is discharged, while relatively moving the droplet discharge head 1 (the nozzle 25) and the substrate P with regard to each other (in FIG. 7, the substrate P moves in the right direction) will be described.

In the embodiment, the nozzles 25 are arranged in a line form in a relative moving direction. The relative moving velocity of the substrate P is synchronized with the discharge frequency of the droplet according to the array pitch between the nozzles. To be more precise, assuming that the array pitch is H, the relative moving velocity of the substrate P is VP, and the discharge frequency of the droplet L is f, the relative moving velocity and the discharge frequency, which satisfy Equation 1, are used.

$$H = VP/f \qquad (1)$$

A columnar body T on which droplets having the same number as that of the nozzles are accumulated on the substrate P can be formed by discharging the droplets in accordance with the condition satisfying Equation 1.

Furthermore, in the embodiment, the number of droplets accumulated is known by every nozzle. Thus, the laser light source 12 is disposed at a location that shifts to a height depending upon the number of droplets. Further, only a focal position of an optical element can be changed without changing the height of the laser light source 12.

Furthermore, the laser light source 12 has irradiation distribution of an elliptical shape, wherein the relative moving direction is a longitudinal direction so that a landing location (on the substrate P or on a droplet that is previously coated) of the droplet is caught in the beam edge. Accordingly, while the substrate P moves and the coated droplet L reaches the next landing location, the droplet L can be dried or baked and fixed.

In the embodiment, not only the same operation and effects as those of the first embodiment can be obtained, but also the substrate P does not need to be stopped whenever the conductor post T is formed. Therefore, in the embodiment, since time loss in acceleration and deceleration of the substrate P can be prevented, higher productivity is realized.

Further, in the embodiment, where the conductor post T is formed in plural columns, nozzles and laser light sources can be arranged in plural in a direction orthogonal to the plane.

Furthermore, in the first and second embodiments, it has been described that the laser light source is disposed every nozzle. It is to be understood that the array of a beam spot can be formed using diffraction rating, and a construction in which optical fiber distributes laser light can be used.

The multi-layered wiring board obtained by the method of manufacturing the multi-layered wiring board can be applied to a variety of electronic devices having semiconductor devices, etc. The variety of electronic devices having this multi-layered wiring board all becomes electronic devices according to the invention.

Furthermore, the multi-layered wiring board can be applied to various display devices or driving devices other than the electronic devices. These devices can be preferably used for a display unit, etc. in portable information processing devices including a word processor, a personal computer, etc., or various electronic devices including a mobile telephone, a wristwatch type electronic device, etc.

Figure 8A:
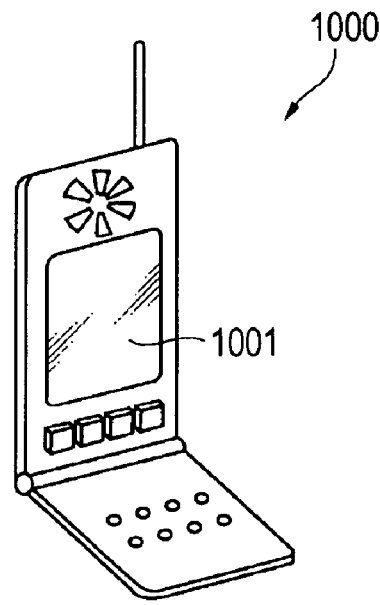
FIGS. 8A to 8C are views illustrating electronic apparatus according to the invention.
Figure 8B:
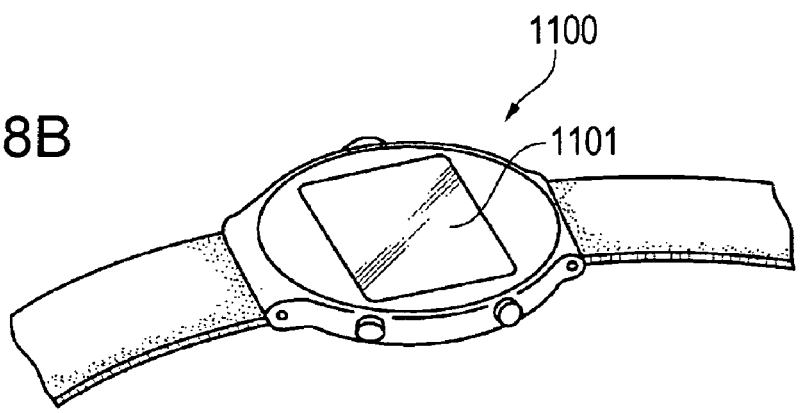
Figure 8C:
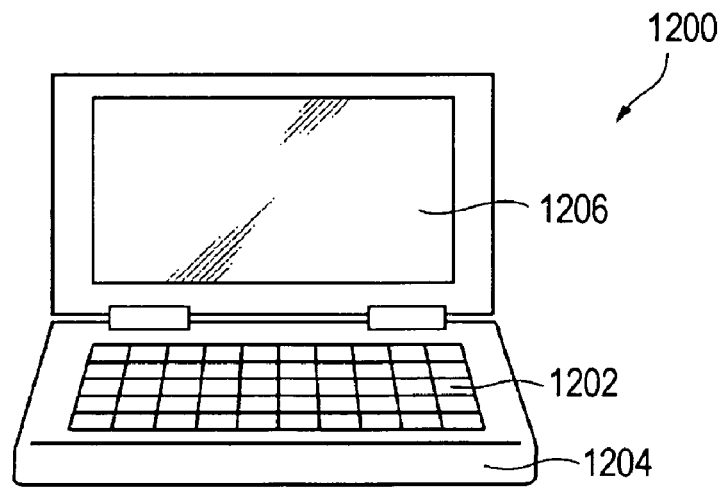

FIGS. 8A to 8C are views illustrating electronic devices using the multi-layered wiring board according to an embodiment of the invention.

FIG. 8A is a perspective view illustrating an example of a mobile telephone. In FIG. 8A, reference numeral 1000 indicates a mobile telephone body (an electronic apparatus), and reference numeral 1001 indicates a display unit.

FIG. 8B is a perspective view illustrating an example of a wristwatch type electronic apparatus. In FIG. 8B, reference numeral 1100 indicates a watch body (an electronic apparatus), and reference numeral 1101 indicates a display unit.

FIG. 8C is a perspective view illustrating an example of a portable information processing apparatus such as a word processor and a personal computer. In FIG. 8C, reference numeral 1200 indicates an information processing apparatus (an electronic apparatus), 1202 indicates an input unit such as a keyboard, reference numeral 1204 indicates an information processing apparatus body, and 1206 indicates a display unit.

Each of the electronic apparatuses shown in FIG. 8A to 8C includes the multi-layered wiring board according to the invention. It is thus possible to realize a compact electronic apparatus having improved accuracy and high quality.

While the invention has been described with reference to the particular illustrative embodiments, it is not to be restricted by the embodiments but only by the appended claims. All the shapes or a combination of respective constituent elements shown in the embodiments are illustrative. It is to be appreciated that those skilled in the art can change or modify the embodiments without departing from the scope and spirit of the invention.

For example, in the embodiments, the structure in which the two-layer wiring board 30 to be fabricated has a two-layer structure having the conductor layers E1 and E2, and the conductor post T that electrically connects the conductor layers E1 and E2, on the substrate P has been described. It is to be noted that the invention is not limited thereto, but can be applied to fabrication of multi-layered wiring boards having a three-layer structure or a four or more layer structure.

What is claimed is:

1. A method of manufacturing a multi-layered wiring board having at least two conductor layers, an interlayer insulation layer provided between the conductor layers, and a conductor post that electrically connects the conductor layers, on a substrate, the method comprising:
   discharging a first droplet containing a conductive material from a discharge head;
   piling successive droplets on the first droplet to form the conductor post; and
   applying light energy from a laser light source to the piled droplets between successive droplets as the droplets are piled on the conductor post and during discharge of subsequent droplets from the discharge head;
   moving an optical element of the laser light source based on a position of a top droplet disposed on the conductor post; and
   changing a focal position of the laser light source to a crown of the top droplet;
   wherein less light energy is applied to droplets piled on the conductor post than is applied to the first droplet disposed on the substrate; and
   wherein the light energy is applied to the discharged droplet before the droplet spreads by wetting at a landing portion of the substrate.

2. The method of manufacturing a multi-layered wiring board according to claim 1, wherein the amount of applied light energy is set according to a material of the landing portion of the droplet.

3. The method of manufacturing a multi-layered wiring board according to claim 1, further comprising:
   detecting a top location of the accumulated droplet; and
   adjusting a location at which the light energy is applied based on the detected top location.

4. The method of manufacturing a multi-layered wiring board according to claim 1, further comprising:
   applying droplets, while relatively moving a plurality of nozzles that discharge the droplets and the substrate with respect to each other, and
   wherein the relative moving velocity of the substrate and a discharge frequency of the droplets are synchronized with each other according to an array pitch of the nozzles.

5. The method of manufacturing a multi-layered wiring board according to claim 4,
   wherein irradiation distribution of the light energy has an elliptical shape whose longitudinal direction is the relative moving direction.

6. The method of manufacturing a multi-layered wiring board according to claim 1,
   wherein the droplet contains a photothermal conversion material.

7. The method of manufacturing a multi-layered wiring board according to claim 1,
   wherein the at least two conductor layers and the interlayer insulation layer are formed by means of a droplet discharge method.

* * * * *